US009641263B2

(12) United States Patent
Jones et al.

(10) Patent No.: US 9,641,263 B2
(45) Date of Patent: May 2, 2017

(54) DERIVING BROADBAND COMMUNICATION SYSTEM SERVICE AREA FOR SIGNAL LEAKAGE DETECTION

(71) Applicant: ComSonics, Inc., Harrisonburg, VA (US)

(72) Inventors: Raymond Gregory Jones, Stephens City, VA (US); Dennis A. Zimmerman, Bridgewater, VA (US)

(73) Assignee: ComSonics, Inc., Harrisonburg, VA (US)

( * ) Notice: Subject to any disclaimer, the term of this patent is extended or adjusted under 35 U.S.C. 154(b) by 580 days.

(21) Appl. No.: 13/735,555

(22) Filed: Jan. 7, 2013

(65) Prior Publication Data

US 2014/0195176 A1    Jul. 10, 2014

(51) Int. Cl.
*H04B 17/00* (2015.01)
*G06F 17/00* (2006.01)
*H04W 16/18* (2009.01)
*G01R 29/08* (2006.01)
*H04W 24/08* (2009.01)

(52) U.S. Cl.
CPC ......... *H04B 17/00* (2013.01); *G01R 29/0814* (2013.01); *H04W 16/18* (2013.01); *H04W 24/08* (2013.01)

(58) Field of Classification Search
CPC ......... G06F 17/00; G06F 15/00; G01R 31/00; G01R 29/0835; H04B 17/00
See application file for complete search history.

(56) References Cited

U.S. PATENT DOCUMENTS

| | | | | |
|---|---|---|---|---|
| 4,072,889 | A | * | 2/1978 | Witmer et al. ................. 323/266 |
| 4,344,142 | A | * | 8/1982 | Diehr, II ............. B29C 35/0288 |
| | | | | 264/325 |
| 5,294,937 | A | * | 3/1994 | Ostteen et al. ............... 342/459 |

(Continued)

OTHER PUBLICATIONS

BPR-8,Part 8: Application procedures and Rules for Broadcasting Receiving Undertakings (Cable Television), Jan. 2009, Spectrum management and telecommunications, Part-8, 1-22.*

(Continued)

*Primary Examiner* — John Breene
*Assistant Examiner* — Mohammad Islam
(74) *Attorney, Agent, or Firm* — Whitham, Curtis & Cook, P.C.

(57) ABSTRACT

An improved, adaptive and uniformly applicable estimation of the percentage or fraction of a broadband communication system (BCS) plant that is monitored for signal egress during a given period of time is provided by generating and collecting polygons along all possible routes traversed by BCS service vehicles within a service area, preferably by comparison with a roadway map, to define the service area with improved accuracy. The number of polygons generated and collected is then limited by the number of polygons in which DCS service vehicles have been reported in a given period of time or inspection interval. The limited number of polygons is then divided by the number of polygons generated and collected to determine a fraction or percentage of the BCS system which has been monitored during the given time period and can be used in a computation of a cumulative leakage index (CLI) value.

22 Claims, 3 Drawing Sheets

(56) References Cited

U.S. PATENT DOCUMENTS

| | | | |
|---|---|---|---|
| 5,777,662 A * | 7/1998 | Zimmerman | 725/125 |
| 6,005,518 A | 12/1999 | Kallina | |
| 2005/0120196 A1 | 6/2005 | Zito | |
| 2007/0022457 A1 * | 1/2007 | Eckenroth et al. | 725/107 |
| 2011/0085456 A1 * | 4/2011 | Zimmerman | H04L 41/0681 370/252 |
| 2013/0004179 A1 | 1/2013 | Nielsen et al. | |
| 2013/0110466 A1 * | 5/2013 | Zimmerman | G01R 29/0835 702/189 |

OTHER PUBLICATIONS

Supreme Court, *Alice Corp.* Vs *CLS et al.*, Oct. 2013, pp. 1-23.*
Spectrum Management and Telecommunications: Broadcasting Procedures and Rules; "Part 8: Application Procedures and Rules for Broadcasting Receiving Undertakings (Cable Television)"; Issue 2, Jan. 2009, entire document.

* cited by examiner

DERIVING BROADBAND COMMUNICATION SYSTEM SERVICE AREA FOR SIGNAL LEAKAGE DETECTION

FIELD OF THE INVENTION

The present invention generally relates to maintenance of broadband cable communication systems (BCS) and, more particularly, to determining the proportion of the service area of a broadband communication service area inspected during a given period of time.

BACKGROUND OF THE INVENTION

Cable telecommunications systems, sometimes referred to as broadband communication systems (BCSs), have been known for a number of years and are currently gaining in popularity and coverage for the distribution of television programming, telephone service and networking of computers such as providing Internet access since they can carry many signals over a wide bandwidth with little, if any interference or distortion, particularly as data transmission rates have increased to accommodate high definition television, increased volume of digital communication and the like. By the same token, since these communications are intended to be confined within the cable system, the increased bandwidth required for such communications need not be allocated from the available bandwidth for other communications such as radio, navigation, GPS, emergency communications and the like which must be transmitted as free-space electromagnetic waves through the environment. However, flaws in cable shielding in cable telecommunication systems can allow signal egress which can potentially interfere with free-space broadcast communications and potentially cause hazards. Reciprocally, flaws in cable shielding can permit signal ingress into the cable from the environment and degrade or interfere with the signal being carried by the cable telecommunication system. Therefore, such flaws must be quickly discovered and remedied as they occur due to weather, mechanical damage or the like. Such monitoring is generally performed by permanently installing signal leakage receivers and global positioning system receivers in BCS service vehicles which will normally cover a substantial portion of the service area in a relatively short period of time while executing work orders for installations and repairs of the BCS. The location of the service vehicle is constantly monitored and reported. When an egress signal of significant signal level is detected, the vehicle location and egress signal strength can be recorded or automatically reported and appropriate work orders issued to correct any such shielding flaw.

Since a broadband communication system signal leaking from a shielding flaw has the potential for interference with free-space communication signals, broadband communications systems are subject to federal regulations and continuous monitoring and periodic reporting is required. Specifically, a BCS operators must identify leakage signal amplitudes for all leaks and to identify the service or plant area covered during a given time period and to insert such information into an equation such as $$CLI = 10 * \log_{10}\left(\frac{1}{\varphi}\sum_{i=1}^{n} E_i^2\right)$$

in which:
$\varphi$=percentage or fraction of the plant/service area covered,
i=number of qualified leakage elements, and
E=qualified leakage measured signal level.

The value of this equation is referred to as the cumulative leakage index (CLI) which must be reported periodically (e.g. quarterly) and reports leakage above a threshold strength actually discovered in an area of the BCS plant by inspection projected over the entire service area of the BCS plant. That is, if 75% of the BCS plant was inspected during an inspection period, the value of $1/\varphi$ in the equation would be 1/0.75 or 1.333. Such an equation sums the square of all detected shielding flaws having a radiated signal level above a given value (e.g. greater than 50 µV per meter to be "qualified" for reporting) and effectively normalizes, averages or projects that total radiated power over the entire BCS plant by the proportion of the plant or service area covered by inspection during a given period of time. The proportion of plant or service area covered must be at least 75%. The CLI is thus a projected measure of the total radiated power from shielding flaws over the entire BCS plant and is thus an approximate measure or figure of merit of the overall shielding quality or condition of the BCS. Such a computation is generally performed more or less continuously on a rolling basis such that the time period covered is substantially constant.

However, while egress signal level can be measured with substantial accuracy, such a computation can be significantly affected by the technique used to approximate $\varphi$, the proportion of the service area that is covered by service vehicles that are providing automatic inspection of the BCS for egress signal leakage through shielding flaws. Since different techniques can be used to approximate both the area covered by inspections and the overall total service area of the BCS system plant (e.g. signal distribution area) and the installation of a given BCS plant may not be uniform over the geographical extent of the service area, computed CLI values may vary greatly for a given BCS plant, depending on the regions of the plant actually inspected, even if the approximation is consistently performed, and comparison of CLI values between different BCS plants is not particularly meaningful.

SUMMARY OF THE INVENTION

It is therefore an object of the present invention to provide a method and apparatus for computing a figure of merit which is of improved accuracy and consistency between BCS plants and for a given BCS plant.

In order to accomplish these and other objects of the invention, a method of calculating an estimated figure of merit reflecting the shielding integrity condition of a BCS plant is provided comprising steps of generating and collecting polygons corresponding to locations of a broadband communication system (BCS) egress signal detector that is movable throughout a service area, limiting a number of polygons generated and collected to locations of said BCS egress signal receiver during a given period of time, dividing a limited number of locations by a total number of locations to determine a value, and dividing a measurement of egress signal strength by that value.

In accordance with another aspect of the invention, an apparatus for calculating the fraction or percentage of a broadband communication system (BCS) plant which is monitored for signal egress over a given period of time is provided comprising a global positioning system receiver, a BCS signal egress receiver, and one or more computers configured to perform functions of generating and collecting polygons corresponding to locations of a broadband communication system (BCS) egress signal detector that is movable throughout a service area, limiting a number of polygons generated and collected to locations of said BCS egress signal receiver during a given period of time, and dividing a number of locations determined in said limiting step by a number of locations determined in said generating and collecting step to determine a value.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
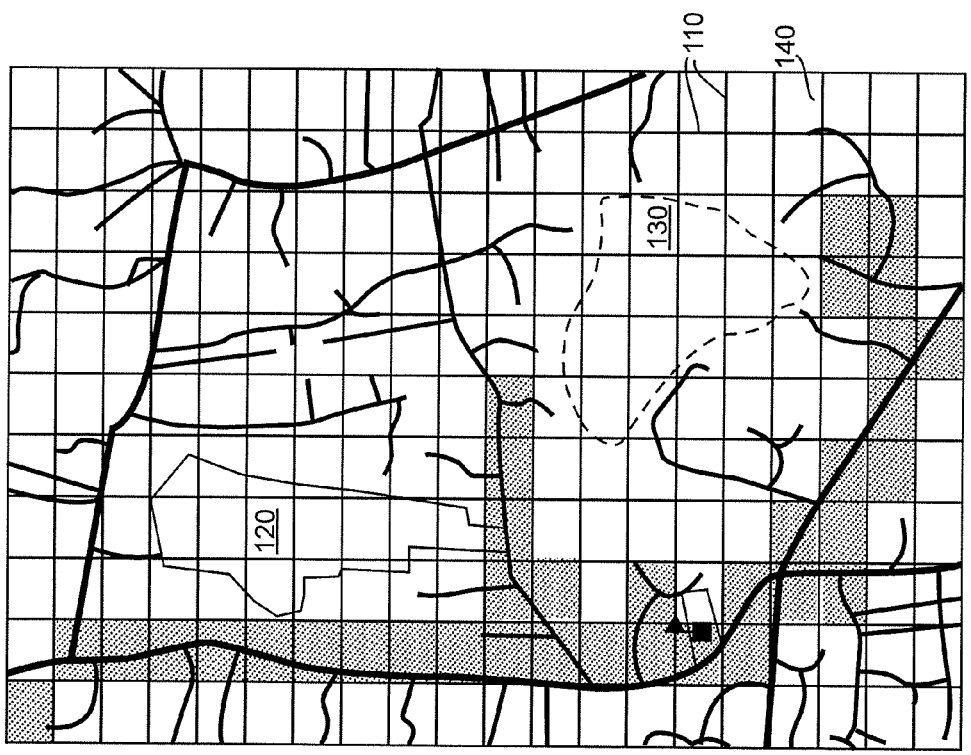
FIG. 1 is a schematic illustration of a known technique of approximating inspection coverage, useful for conveying an understanding of the problems addressed by the invention.

Referring now to the drawings, and more particularly to FIG. 1, there is shown an exemplary map of a service area of a BCS plant which illustrates a known method of approximating a proportionate inspection area. Since FIG. 1 is intended to represent an arbitrary BCS plant service area and is arranged to convey an understanding of the problem addressed by the invention, no portion of FIG. 1 is admitted to be prior art as to the present invention. However, since the invention is not represented in FIG. 1, FIG. 1 has been designated as "Related Art".

FIGS. 1-4 are maps of an exemplary portion of a service area of a BCS in approximating the inspected area and the entire service area to develop an approximation of $\phi$ for the above calculation. The maps of FIGS. 1-4 represent an area much smaller than the entire service area for clarity in discussion of the principle of the invention but may, nevertheless, be regarded as the entire service area for purposes of the following discussion. For convenience of installation and servicing as well as inspection of the shielded cables of a BCS plant, the shielded cables are generally placed along roadways and, when most of the inhabitants of an area are subscribers to the BCS, a map of roadways is usually a close approximation of a map of shielded cable installation. (In contrast, maps of a BCS plant installation are often inaccurate or not kept current and generally reside on topographical maps in 7.5 minute longitude and latitude format which are inaccurate and incompatible with GPS format data. Even where a geocoded conversion has been performed, it is likely that a further data translation involving significant manual intervention and manipulation will be required.)

Several different techniques for approximating the respective areas are possible, each of which exhibits particular difficulties and inherent inaccuracies. For example, the entire service area may be divided into a matrix of sub-areas by superimposing a grid thereon, as illustrated by lines 110 in FIG. 1. Since the location of service vehicles having egress signal receivers installed therein is constantly monitored by GPS receivers also installed therein, the paths of the vehicles are tracked and the corresponding sub-areas are identified and reported, either in real time by wireless transmission or stored and downloaded when the vehicle returns to a central facility. Such a service vehicle route within the area depicted in the map of FIG. 1 is represented by shaded sub-areas. Thus, the ratio of the number of shaded areas through which a service vehicle has traveled to the total number of sub-areas in the total service area of the BCS plant might be regarded as a reasonable approximation of the proportion of the area inspected to the total service area. However, areas 120 and 130 of FIG. 1 represent areas (e.g. a golf course and a farm, respectively) where service from a BCS plant is neither needed nor desired. Similar areas would be large parks, such as Central park in New York City or Forest Park in St. Louis, Mo., amusement areas and or geographical features of the area such as the Chicago River. Multi-dwelling developments such as town houses, large hotels and, possibly, public facilities that may or may not receive service from a given BCS plant but are responsible for maintenance of their own distribution systems would have similar effects of the approximation of $\phi$.

Therefore, for regions of a BCS plant where such areas exist, the total area of the service area will necessarily be too large for purposes of an approximation such as is illustrated in FIG. 1 and may even prevent the inspected area from reaching the required 75% of the total area even when the entirety of the BCS plant is inspected. On the other hand, locations where a road or shielded cable extend only a short distance into a sub-area, as illustrated at 140 of FIG. 1, inspection of that short length of shielded cable would result in that portion of the BCS plant being accounted as an unduly large proportion of the BCS cable plant in the approximation of $\phi$.

Another problem with the above-described methodology and other known methodologies derives from the fact that service vehicles are generally operated from a central facility to which they generally return at least once per day. Such a mode of operation inherently causes an increased weighting of signal egress detection in accordance with distance from the central facility; egress signal detections more proximate to the central facility being reported comparatively more often. This issue is addressed in U.S. Pat. No. 7,952,363, assigned to the assignee of the present invention and hereby fully incorporated by reference. It is also reasonable to expect that the error in approximation of $\phi$ will be multiplied in accordance with the number of service vehicles used by the BCS plant.

Figure 4:

In order to avoid the above-described difficulties in known methods of approximating $\phi$. the method in accordance with the invention will now be explained with reference to FIGS. 2-4 which contain maps of the same exemplary portion of the service area shown in FIG. 1. The method of approximating $\phi$ in accordance with the invention is basically an adaptive or self-learning method and the respective stages thereof are shown in the sequence of FIGS. 2-4.

Figure 2:
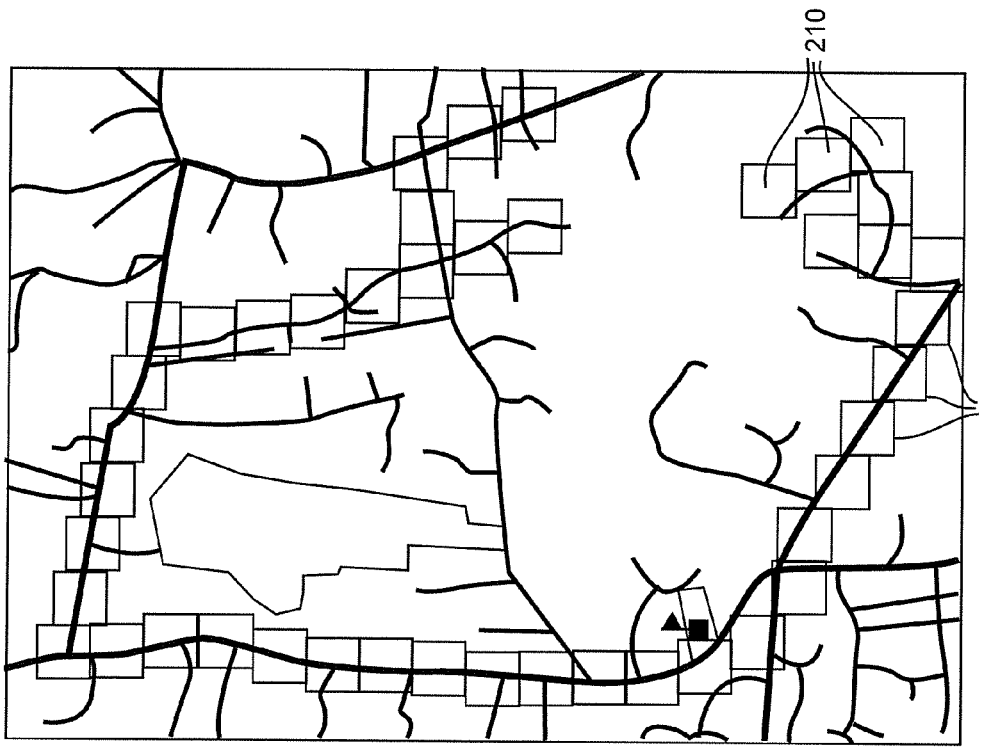
FIGS. 2, 3 and 4 are schematic illustrations of the approximation technique in accordance with the invention.
Figure 3:
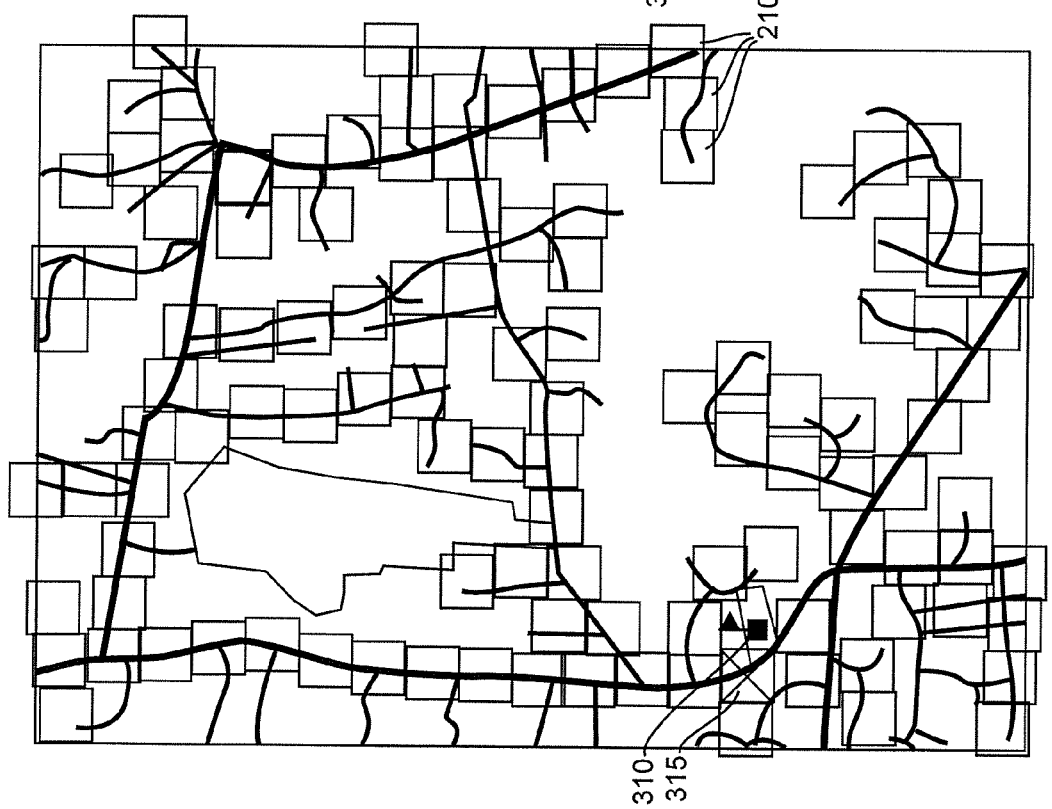

The method begins, as shown in FIG. 2, with a service vehicle being directed into a portion of the service area. As alluded to above, the location of the service vehicle is monitored by the GPS receiver installed within it and the service vehicle position is reported to a central facility. The frequency of reports of service vehicle position can be adjusted for speed of the vehicle or locations interpolated or extrapolated by processing at the central facility from locations reported at a constant frequency while the vehicle is in motion to develop contiguous but, preferably, non-overlapping equal polygonal areas 210, depicted as squares in FIGS. 2-4. The shape of these areas is unimportant for practice of the invention and any polygonal shape can be used. Similarly the actual area of the polygons is unimportant to the practice of the invention for reasons that will become clear from the following discussion. If a polygon has not previously been recorded at a given location, these locations and areas are recorded at a central facility or other suitable data processing location.

At a minimum, a polygonal area is used rather than a distance along a roadway so that the CLI computation or estimation of $\phi$ is, in fact, a ratio of areas. The transverse dimensions of polygonal areas should also be chosen to provide compensation for common GPS inaccuracy and should preferably be no larger than the distance a service vehicle would travel at the posted speed limit in the region during a GPS reporting interval (e.g. one second). The transverse dimension of polygons should also preferably take into account a realistic estimate of the average lengths of service drops on either side of the distribution cable and unpredictability of directionality of egress signal radiation. Within these considerations, dimensions of the polygons may be chosen in accordance with the available data processing resources since larger polygons produce fewer data points over the entire BCS system.

This process continues until it can be determined from a comparison with maps of roadways and other information about location of shielded cables of the BCS plant that polygons have been defined that cover all possible service vehicle routes in the service area or at least all routes using roadway where shielded cable has been installed. The result of continued collection of locations and polygonal areas is illustrated in FIG. 3. It should be noted that no polygons are defined or collected for areas corresponding to areas 120 or 130 of FIG. 1; which areas were a major source of error in previously known methods of approximating $\phi$. Polygons adjacent to facilities such as a school 310 having responsibility for their own distribution system may be deleted or tagged as shown in FIG. 3 depending on the strength and frequency of leak detections at such locations to facilitate interception of automatically generated work orders when leakage is detected in such locations.

However, it should be understood that the invention can be used for signal egress detection and reporting and $\phi$ approximated with improved accuracy before this process is entirely complete by estimating areas for which polygons have not yet been collected from the lengths of segments of such roads. In fact, all polygons could be estimated with a maximum area error for squares being limited to the square root of two (e.g. a factor of about 1.414) which is comparable to, if not an improvement over worst case conditions of applications of known techniques for estimating $\phi$. However, as a practical matter, polygons will be collected in accordance with the invention beginning with the first service vehicle location reported and accuracy will continually improve until the collection of polygons is considered to be complete. It should also be appreciated in this regard that the service vehicle is also continually monitoring for egress signals and that each reported location of the service vehicle when suitably limited to a given period of inspection reporting also provides a location of an equal area that has been inspected. Therefore, an approximation of $\phi$ can be determined (albeit with relatively low accuracy) from the very first polygon collected (since inspection occurs concurrently with initial collection of any given polygon) and CLI can be computed from the first detection of a qualified egress signal. That is, the collection of a polygon, the determination of an inspected area of the BCS plant and the detection of an egress signal and its strength, the only information required for computing the CLI value, can all occur simultaneously and are available at the time of the first egress signal detection.

It should also be noted from FIG. 3 that, in many urban areas (of which the maps of FIGS. 1-4 are not particularly representative), rights-of-way such as alleys and service roads may exist along which BCS cables are installed although BCS service vehicles would not ordinarily traverse them. Rather, monitoring of such areas can be performed from ordinary streets located generally parallel to such rights-of-way. Such a circumstance causes some degree of redundancy of the polygons collected that may skew the calculation of an estimate of $\phi$. Such redundancies may be removed manually by inspection and comparison of street maps with BCS plant maps but such a process is very labor intensive and subject to inaccuracies. Instead, it is considered preferable to collect all possible polygons along routes traveled by BCS service vehicles and to delete polygons that are not visited by a service vehicle within an extended period such as one year, preferably after checking that the corresponding portion of cable has, in fact, been monitored from another polygon location within the same period of time. Thus, the methodology of the invention also provides for adaptive and self-learning improvement in accuracy over time in this regard, as well by limiting the effective service area to that of polygons from which monitoring sufficient to cover the entire BCS plant area is actually performed.

During ongoing use of the invention (e.g. after polygon collection is sufficiently or substantially complete), further reported location of the service vehicle at locations where polygons have been collected will form part of the number of polygons which may be considered as having been inspected during a given time interval or within a rolling number of location reports to be included within a current CLI value. These locations are indicated with a circle within collected polygons in FIG. 4 and identify areas which are equal to the areas of collected polygons. Therefore the ratio of the number of areas considered to have been inspected during an inspection period to the number of polygons collected (including polygons that may be estimated and/or excluding polygons deleted as being redundant as alluded to above) is the value of $\phi$ and the approximated value thereof is substantially exact. It should be appreciated that during polygon collection and ongoing use, the operation of collecting polygons is collected over the entire geographical extent of the service area (only an exemplary portion thereof being illustrated in FIGS. 2-4) even though only a relatively small area corresponding to the location of portions of the BCS plant subject to the possibility of signal egress is thereafter considered as the actual BCS plant service area. Similarly, the travel of service vehicles should be considered as extending over the entire geographical extent of the BCS plant service area and not only over the portion thereof shown in FIGS. 2-4. It should also be appreciated that the invention can be practiced separately in different regions or less than all regions of the service area (e.g. the invention can be used to supplement and improve overall accuracy of the approximation of $\phi$ and the CLI value computation while known approximation and calculation methods are used for the majority of the service area of a BCS plant) and that the polygons may be collected at different rates for different regions.

Figure 5:
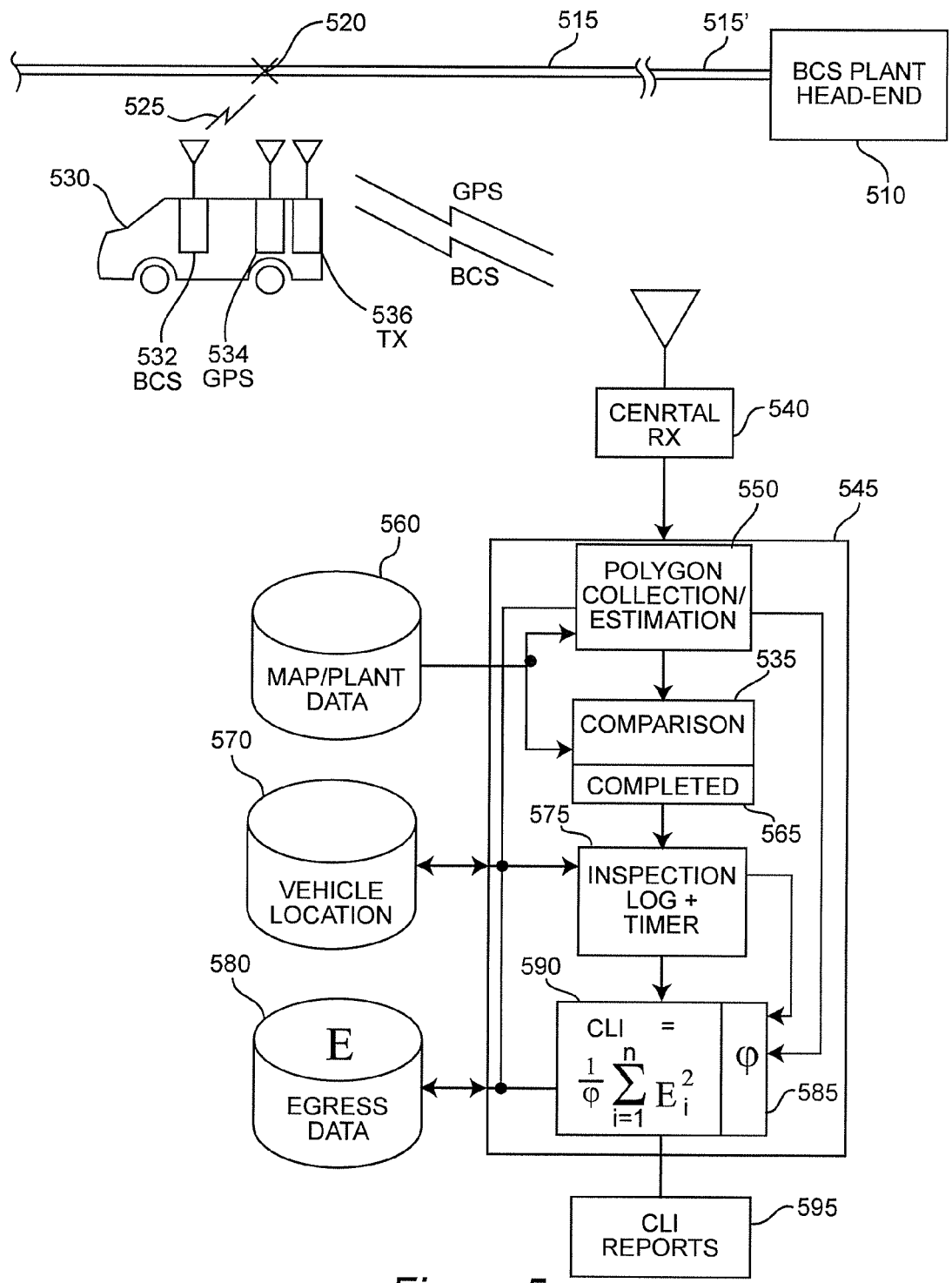
FIG. 5 is a schematic diagram of a data processing architecture in accordance with the invention which also represents the data flow of an exemplary method in accordance with the invention.

Referring now to FIG. 5, an exemplary preferred architecture for the practice of the invention will now be discussed. As alluded to above, those skilled in the art will recognize that FIG. 5 can also be understood as a data flow diagram embodying the methodology described above. It is also to be appreciated and understood that FIG. 5 is arranged to facilitate conveyance of an understanding of the invention and many different hardware arrangements and configurations are suitable for carrying out the invention. In this regard, it should also be understood that it is preferred to practice the invention by configuring one or more general purpose processors or computers with software to provide the structures having the functionalities illustrated since such processors or computers are already part of the equipment necessary to provide general installation, monitoring, testing and maintenance of the BCS plant and no additional equipment costs need be incurred to obtain the additional functions of the invention.

In FIG. 5, the head-end of the BCS plant is depicted at 510 and provides the broadband signals that are delivered through shielded cable 515. At the present state of the art, a substantial initial portion of the distribution system (e.g. depicted by 515') is often provided through fiber-optic cables which are not subject to leakage of electromagnetic signals that may interfere with free-space communications and are not important to the present invention. However, distribution of signals further downstream from the fiber-optic portion of the distribution system are provided through shielded cables which are subject to such leakage where flaws occur in the shielding integrity, as depicted at 520. The egress signal 525 is essentially broadcast into the environment and is received by BCS signal receiver 532 in a service vehicle traveling on roadways along which shielded distribution cables 515 are installed, as alluded to above. The BCS receiver not only detects the existence of an egressing BCS signal but also measures the field strength of the signal. The value can be adjusted for the distance of the service vehicle from the location of cable 515 during post-processing at a central facility so that the severity of the shielding flaw can be directly evaluated and qualified for inclusion in the CLI computation.

At the same time, the position of the service vehicle is continually tracked, usually at one second intervals while the vehicle is in motion, using GPS receiver 534 installed in the service vehicle. The locations through which the service vehicle can simply be logged for later downloading but it is considered to be preferable for the outputs of both the BCS receiver and the GPS receiver be connected to a transmitter 536 for immediate wireless communication to a central facility, as illustrated. Thus, transmitter 536 transmits the service vehicle location and, if an egress signal is detected, data regarding the field strength of the egress signal. This data is preferably received by receiver 540 located at a central facility of the BCS plant (or logged and later downloaded) and provided to processor 545. It should be understood that the hardware portion of the architecture described thus far is also common to known techniques of BCS signal egress monitoring.

Within processor 545, software is provided to configure a portion of the processor for collection or estimation of polygons as described above from the GPS location information. Processor 545 is also capable of accessing one or more databases containing three types of information which are separately illustrated as map data 560 (which can be obtained, as needed, from commercial or Internet sources), a vehicle location log 570 for collecting GPS service vehicle location data received by receiver 540 and egress signal strength data ("E" in the CLI equation) for collecting BCS signal strength data received by receiver 540. In accordance with the invention, the processor 545 is provided with programming software that configures portions of the processor 545 to provide four functionalities, each of which is relatively simple and suitable programming will be evident to those skilled in the art in view of the methodology described above in connection with FIGS. 2-4.

The first of these functionalities (550) is to generate and collect or estimate polygons 210 as the service vehicle traverses roadways within the general service area of the BCS plant as illustrated in FIG. 2. Map data (which may include data regarding locations of shielded cable) can be used in this process but is not necessarily required for collection of polygons but could be helpful in placing polygons to optimize the number of polygons, determine an optimum size of the polygons (which is otherwise arbitrary, as explained above) and avoiding excessive overlapping of polygons. (It has been discovered that a minor degree of overlapping of polygons is unimportant to the successful practice of the invention since the same polygons are used in both the numerator and denominator of the CLI calculation. That is, while different styles, sizes or shapes of polygons can be used in respective portions of the service area, the only significant distinction between "collected" polygons, used in the denominator of the CLI calculation, and "inspected" polygons, used in the numerator of the CLI calculation is the date range selected for the "inspected" polygons whereas "collected" polygons will generally comprise all polygons previously visited by a service vehicle and correspondingly defined.) However, map data would be required for estimation (from roadway distances) of polygons not yet traversed by the service vehicle. As the polygons are generated and collected (or estimated and replaced as corresponding polygons are generated) the locations of polygons are stored as vehicle location data in database 570.

The second of these functionalities, comparator 555 receives the polygon data as it is generated and compares the locations of polygons with map data 560. A determination is then made from the comparison as to whether or not the generation of polygons is complete to cover all possible routes a service vehicle may take through the service area or portion thereof to which the invention may be applied, as illustrated at 565. If the comparison indicates that the polygon generation is complete, as illustrated in FIG. 3 optimum accuracy of the estimation of $\phi$ will be assured. If polygon generation is incomplete, it is still possible to obtain not only an improved estimate of $\phi$ but also an indication of the confidence level of the estimation from the proportion of roadway length for which polygons have been generated at any given point in tile after deployment of the invention.

The third functionality, schematically depicted at 575, receives an output from the completeness determination made at 555, 565 and exchanges data with service vehicle location database 570. This functionality simply truncates or limits data from the service vehicle location database to contain only data corresponding to a period of time that is of interest. That is, a log of the actual locations that have been visited or "inspected" is not important to the CLI calculation. However, such a log may be useful if the proportion of the service area that is visited or "inspected" during the time interval is insufficient (e.g. less than 75% of the service area, as noted above) in order to determine additional areas that have not been visited during the time interval of interest. Since the inspection area data will usually cover only the most recent service vehicle locations, a timer is preferably included such that the locations considered will be a rolling block with older locations being discarded as new locations are added. The result of this operation is depicted in FIG. 4 by adding of circles to the polygons 210 of FIG. 3 to indicate the polygons that are represented in the inspection data.

The fourth functionality, depicted at 585 and 590, is a computation of $\phi$ and, using that value, a computation of CLI. The computation of $\phi$ is simply a division operation in which the output of the inspection log 575 (in numbers of polygons as the numerator of the ratio or division) is divided by the output of the polygon collection or estimation function or element 550 (also in numbers of polygons as the denominator of the ratio or division). Again, since the polygons are preferably of equal areas, raw numbers of polygons can be used and the areas of the polygons cancel and are irrelevant to the computation. (If the polygon areas are unequal or variable, suitable adjustments to the computation can be made. However, use of different areas is an unnecessary complication since allowing polygons of equal areas to overlap would not produce a significantly different value of $\phi$ since polygons from the inspection data 575 are necessarily congruent with polygons from the polygon collection element 550 and the only difference would be a slightly increased number of polygons compared to the number of non-overlapping, contiguous polygons.) Once a value of $\phi$ has been determined, element 590 accesses egress data 580, preferably for a time period corresponding to that used for the inspection data or log element 575, squares the signal strengths of egress signals detected and performs a summation of the squared signal strength values which is then divided by the value calculated for $\phi$ to derive the CLI value which can then be reported at 595. Since the value of $\phi$ is necessarily less than 1, the value of $1/\phi$ thus become a multiplier greater than 1 which projects the egress signal detections corresponding to the inspection data or log over the entire BCS plant service area.

In view of the foregoing, it is clearly seen that the invention provides an apparatus and method that can be applied to provide consistent calculation of CLI values for any BCS plant having arbitrary geographical features. Consistent calculation of an estimate of the service area supports meaningful comparisons to be made between CLI values of different BCS plants and can be consistently applied to any and all BCS plants to reveal changes in the figure of merit reflecting overall condition of shielding integrity of the BCS system. This consistency is achieved by constraining the service area of the BCS plant to only those areas where cables subject to shielding flaws and BCS signal egress and does so in a computationally simple manner from data normally collected. No additional hardware is required beyond that currently employed for signal egress detection and the invention can provide improved accuracy and consistency of CLI value computations immediately upon being deployed with accuracy and consistency improving with use until polygons are generated and collected to cover all possible routes through a general service area of a BCS plant of portion thereof to which the invention is applied.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of operating a broadband communication system (BCS) including calculating an estimated figure of merit reflecting the shielding integrity condition of a BCS plant or distribution area, said method of calculating comprising steps of
   generating and collecting polygons corresponding to locations proximate to respective portions of a broadband communication system plant to which a BCS egress signal detector that is physically moved throughout a service area of said BCS during operation of said BCS whereby said service area is constrained to areas where cables subject to shielding flaws and BCS signal egress can be present,
   limiting a number of polygons generated and collected in said generating and collecting step to locations of said BCS egress signal detector during a given period of time,
   dividing a number of locations determined in said limiting step by a number of locations determined in said generating and collecting step to determine a value,
   if said value fails to satisfy a threshold value, moving said BCS signal detector to locations of polygons other than polygons resulting from said limiting step until said value satisfies said threshold value,
   measuring egress signal strength detected by said BCS egress signal detector during said given period of time, and
   dividing a measurement of egress signal strength determined in said measuring step by said value to project detected egress signal strength over an area of polygons generated and collected by said generating and collecting step as an estimate of said figure of merit reflecting said shielding integrity condition of said BCS plant.

2. The method as recited in claim 1 wherein said BCS egress signal receiver is installed within a BCS service vehicle.

3. The method as recited in claim 1 wherein said BCS signal receiver is moved along roadways in the BCS service area.

4. The method as recited in claim 1, wherein said generating and collecting step is performed until polygons are collected for all possible routes within the BCS service area.

5. The method as recited in claim 4, wherein said all possible routes are determined from a roadway or street map of said service area of said BCS system.

6. The method as recited in claim 4, including the further step of
   deletion of polygons that are not reported in said limiting step over a period of time longer than said given period of time if a corresponding portion of the BCS plant can be monitored from the location of another polygon.

7. The method as recited in claim 1 including a further step of
   deleting or marking of polygons adjacent to sources of egress signals that are not part of the BCS system.

8. The method as recited in claim 1, wherein said polygons generated and collected in said generating and collecting step do not overlap.

9. The method as recited in claim 1, wherein said polygons generated and collected in said generating and collecting step are contiguous squares.

10. The method as recited in claim 1 including a further step of
    summing of squares of said measured field strength of detected leaks a locations of polygons identified in said limiting step to form a sum as a measurement of detected egress signal strength wherein said step of dividing a measurement of egress signal strength by said value results in a computation of a cumulative leakage index.

11. The method as recited in claim 1, further comprising a step of issuing work orders to correct shielding flaws to reduce or maintain said figure of merit below a threshold value.

12. The method as recited in claim 1, further comprising a step of adjusting the number of locations through which a BCS egress signal detector is physically moved within the given period of time of said limiting step so that a result of said first dividing step satisfies a predetermined ratio.

13. Apparatus for calculating the fraction or percentage of a broadband communication system BCS plant or distribution area which is monitored for signal egress over a given period of time, said apparatus comprising
  a global positioning system receiver,
  a BCS signal egress detector,
  a vehicle carrying said global positioning system receiver and said BCS signal egress detector to locations corresponding to portions of said BCS plant, and
  one or more computers configured to perform functions of:
    generating and collecting polygons which do not significantly overlap, said polygons corresponding to locations proximate to respective portions of a broadband communication system plant to which said BCS egress signal detector is movable throughout a service area of said BCS during operation of said BCS whereby said service area is constrained to areas where cables subject to shielding flaws and BCS signal egress can be present,
    limiting a number of polygons generated and collected in said generating and collecting step to locations of said BCS egress signal detector during a given period of time,
    measuring egress signal strength detected by said BCS egress signal detector during said given period of time to determine a measured egress signal strength value,
    dividing a number of locations of polygons determined in said limiting step by a number of polygon locations determined in said generating and collecting step to determine a fractional or percentage value of a portion of said BCS monitored during said given period of time,
    if said fractional or percentage value fails to satisfy a threshold, directing said vehicle to locations of polygons other than locations of polygons resulting from said limiting step until said fractional or percentage value satisfies said threshold, and
    dividing said measured egress signal strength by said fractional or percentage value of a portion of said BCS monitored during said given period of time to produce a figure of merit as an estimate of shielding integrity reflecting a shielding integrity condition of said BCS plant.

14. The apparatus as recited in claim 13 wherein said BCS egress signal receiver is installed within a BCS service vehicle.

15. The apparatus as recited in claim 13 wherein said BCS signal receiver is moved along roadways in the BCS service area.

16. The apparatus as recited in claim 13, wherein said generating and collecting operation is performed until polygons are collected for all possible routes within the BCS service area.

17. The apparatus as recited in claim 16, wherein said all possible routes are determined from a roadway or street map of said service area of said BCS system.

18. The apparatus as recited in claim 16, wherein said one or more computers is configured to perform a further operation of
  deletion of polygons that are not reported in said limiting step over a period of time longer than said given period of time if a corresponding portion of the SOS plant can be monitored from the location of another polygon.

19. The Apparatus as recited in claim 13 wherein said one or more computers is configured to perform a further operation of
  deleting or marking of polygons adjacent to sources of egress signals that are not part of the BCS system.

20. The apparatus as recited in claim 13, wherein said polygons generated and collected in said generating and collecting operation do not overlap.

21. The apparatus as recited in claim 13, wherein said polygons generated and collected in said generating and collecting operation are contiguous squares.

22. The apparatus as recited in claim 13 wherein said one or more computers are configured to perform a further operation of
  summing of squares of said measured field strength of detected leaks a locations of polygons identified in said limiting step top form a sum as a measurement of detected egress signal strength wherein said step of dividing a measurement of egress signal strength by said value results in a computation of a cumulative leakage index.

* * * * *